United States Patent
Peoples et al.

(10) Patent No.: US 10,674,237 B1
(45) Date of Patent: Jun. 2, 2020

(54) ELECTRONIC FLUID TRANSMISSION CYCLE COUNTER AND WIRELESS INTERFACE

(71) Applicants: Cameron Hanes Peoples, Jackson, CA (US); Rodney Cameron Peoples, Jackson, CA (US)

(72) Inventors: Cameron Hanes Peoples, Jackson, CA (US); Rodney Cameron Peoples, Jackson, CA (US)

(*) Notice: Subject to any disclaimer, the term of this patent is extended or adjusted under 35 U.S.C. 154(b) by 0 days.

(21) Appl. No.: 16/373,494

(22) Filed: Apr. 2, 2019

Related U.S. Application Data

(60) Provisional application No. 62/660,405, filed on Apr. 20, 2018.

(51) Int. Cl.
*G01V 3/00* (2006.01)
*H04Q 9/02* (2006.01)
*H03K 23/00* (2006.01)

(52) U.S. Cl.
CPC ............. *H04Q 9/02* (2013.01); *H03K 23/00* (2013.01); *H04Q 2209/40* (2013.01); *H04Q 2209/86* (2013.01)

(58) Field of Classification Search
CPC .. H04Q 9/02; H04Q 2209/40; H04Q 2209/86; H03K 23/00
USPC ........................................ 340/853.9
See application file for complete search history.

(56) References Cited

U.S. PATENT DOCUMENTS

| | | | | | |
|---|---|---|---|---|---|
| 5,835,372 | A | * | 11/1998 | Roys | ......................... G01F 3/16 702/105 |
| 7,379,827 | B1 | * | 5/2008 | Roys | ..................... G01F 15/063 702/45 |
| 2016/0130935 | A1 | * | 5/2016 | Manzar | ................. E21B 47/102 166/250.01 |

* cited by examiner

*Primary Examiner* — Tanmay K Shah
(74) *Attorney, Agent, or Firm* — Plager Schack LLP; Mark H. Plager; Stephen Hallberg

(57) ABSTRACT

An electronic sensor for counting of fluid transmission cycle with wireless interface is disclosed that reduces or eliminates problems with mechanical counters by an electronic fluid transmission cycle counter that is more accurate, reduces labor, improves time efficiency, and removes human error from reporting the fluid cycle count values. The electronic sensor with wireless interface to count the fluid transmission cycles eliminates the mechanical aspect of current counters the landfill gas industry uses.

13 Claims, 2 Drawing Sheets

ELECTRONIC FLUID TRANSMISSION CYCLE COUNTER AND WIRELESS INTERFACE

CLAIM OF BENEFIT TO PRIOR APPLICATION

This application claims benefit to U.S. Provisional Patent Application 62/660,405, entitled "Electronic sensor for counting of fluid transmission cycle with wireless interface," filed Apr. 20, 2018. The U.S. Provisional Patent Application 62/660,405 is incorporated herein by reference.

BACKGROUND

Embodiments of the invention described in this specification relate generally to fluid transmission cycle counters, and more particularly, to an electronic fluid transmission cycle counter and wireless interface.

Current counters that record fluid transmission during cycles tend to be mechanical counters. These mechanical devices have many flaws in various fields. An example field of using the mechanical counter is the landfill gas industry where such mechanical counters used have problems such as producing numerous erroneous double counts, the mechanical device becoming corroded ultimately leading to failure, and a requirement of visual access to record the numbers produced on the counter. The requirement of visual access poses an additional problem, especially in the context of the landfill gas industry, in that often time to facilitate visual access, the relevant fluid lines must have a more complex routing that allows for the counter to be located away from the process of interest. This more complex routing provides additional cost in materials, service and installation, as well as an increase in the number of potential failure points of the system.

One field that uses the mechanical counter is the landfill gas industry and, in this field, there are highly corrosive gases in the environment and the counters are usually located outside in various weather conditions. When the corrosive gases encounter the mechanical counters, they tend to corrode the counters which makes it harder for technicians to read the recorded counts. This is further compounded by the potential for inclement weather conditions while attempting to read the recorded counts, making it an inconvenience for the technician to walk around to take the readings produced by the counters.

The current mechanical counters are outdated. For example, the landfill gas industry uses wireless interface devices to record the types and flow rates of gases and various other items, but they do not have a wireless interface device to record the cycles of fluid being transmitted through the pneumatic pumps in the field. The electronic sensor with wireless interface to count the fluid transmission cycles eliminates the mechanical aspect of current counters the landfill gas industry uses.

Therefore, what is needed is a way to eliminate or reduce flaws of conventional mechanical counters with an electronic fluid transmission cycle counter that is more accurate, reduces labor, improves time efficiency, and removes human error from reporting the counter values.

BRIEF DESCRIPTION

A novel electronic fluid transmission cycle counter and wireless interface is disclosed. In some embodiments, the electronic fluid transmission cycle counter and wireless interface includes a fluid transmission cycle counter, a magnetic flux source, a data collection device, and a collection device antenna. In some embodiments, the fluid transmission cycle counter is a device with an electronic sensor for counting of fluid transmission cycles with a wireless interface and includes a micro-controller, a wireless transceiver, a device antenna, a magnetic flux sensor, and diagnostic ports.

The preceding Summary is intended to serve as a brief introduction to some embodiments of the invention. It is not meant to be an introduction or overview of all inventive subject matter disclosed in this specification. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, and Drawings is needed. Moreover, the claimed subject matters are not to be limited by the illustrative details in the Summary, Detailed Description, and Drawings, but rather are to be defined by the appended claims, because the claimed subject matter can be embodied in other specific forms without departing from the spirit of the subject matter.

BRIEF DESCRIPTION OF THE DRAWINGS

Having described the invention in general terms, reference is now made to the accompanying drawings, which are not necessarily drawn to scale, and wherein.

DETAILED DESCRIPTION

Figure 1:
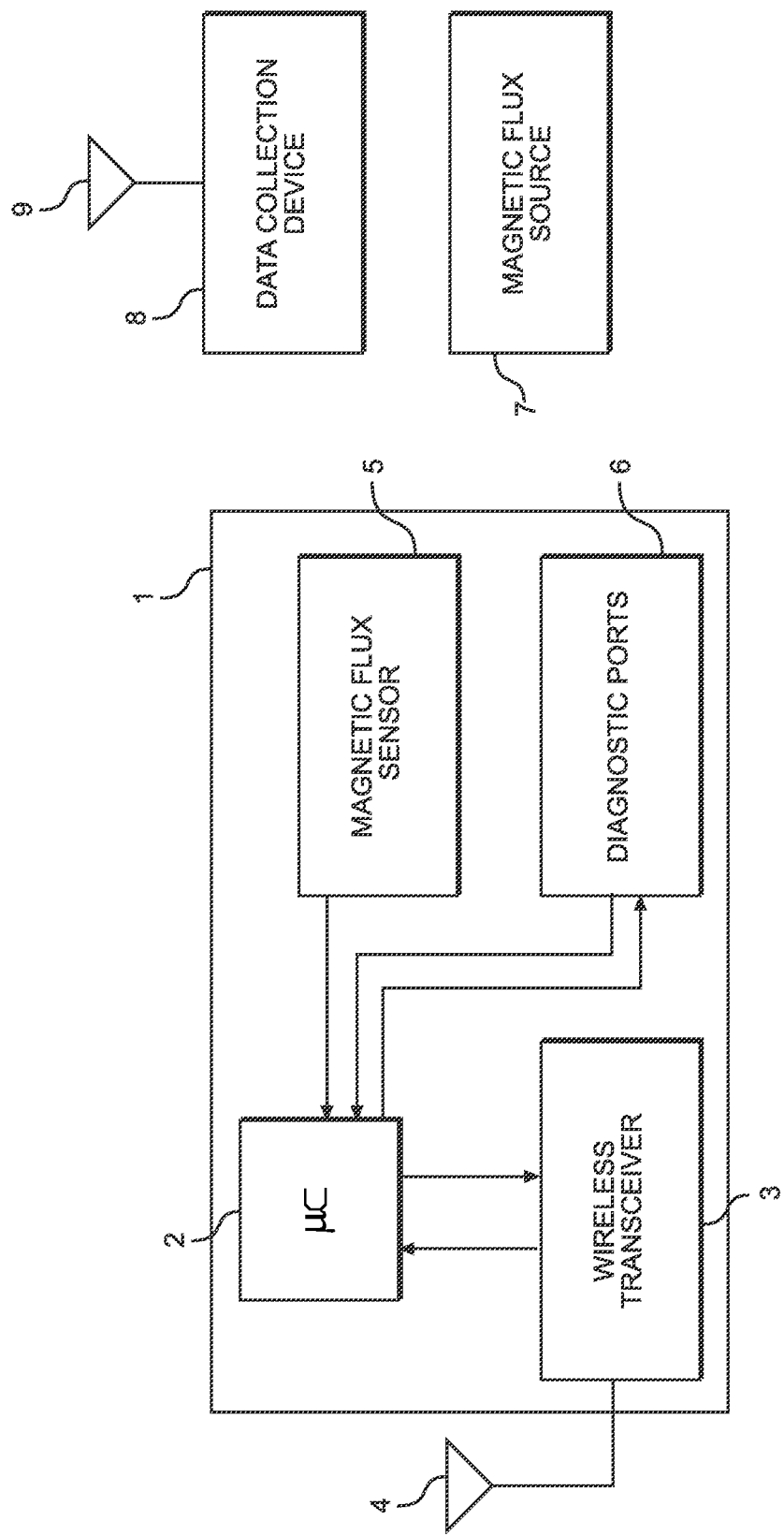
FIG. 1 conceptually illustrates a block diagram of an electronic fluid transmission cycle counter and wireless interface in some embodiments.

In the following detailed description of the invention, numerous details, examples, and embodiments of the invention are described. However, it will be clear and apparent to one skilled in the art that the invention is not limited to the embodiments set forth and that the invention can be adapted for any of several applications.

Some embodiments of the invention include a novel electronic fluid transmission cycle counter and wireless interface. In some embodiments, the electronic fluid transmission cycle counter and wireless interface includes a fluid transmission cycle counter, a magnetic flux source, a data collection device, and a collection device antenna. In some embodiments, the fluid transmission cycle counter is a device with an electronic sensor for counting of fluid transmission cycles with a wireless interface and includes a micro-controller, a wireless transceiver, a device antenna, a magnetic flux sensor, and diagnostic ports.

As stated above, current counters that record fluid transmission during cycles tend to be mechanical counters. These mechanical devices have many flaws in various fields. An example field of using the mechanical counter is the landfill gas industry where such mechanical counters used have problems such as producing numerous erroneous double counts, the mechanical device becoming corroded ultimately leading to failure, and a requirement of visual access to record the numbers produced on the counter. The requirement of visual access poses an additional problem, especially in the context of the landfill gas industry, in that often time to facilitate visual access, the relevant fluid lines must have a more complex routing that allows for the counter to be located away from the process of interest. This more complex routing provides additional cost in materials, service and installation, as well as an increase in the number of potential failure points of the system. Embodiments of the electronic fluid transmission cycle counter and wireless interface described in this specification solve such problems by utilizing an electronic sensor and wireless data communication interface, thereby improving accuracy of the fluid cycle counter device in comparison with conventional mechanical counters used presently in most industries. Similarly, corrosion resistance is improved as the electronic sensor can be hermetically sealed with no moving parts, thus making it impervious to most environmental conditions. The need for visual access and the related routing requirements are eliminated via the wireless interface for reading recorded data, allowing the device to be located anywhere that is convenient for the particular system.

Embodiments of the electronic fluid transmission cycle counter and wireless interface described in this specification differ from and improve upon currently existing, conventional devices and counter options. In particular, some embodiments differ from and improve upon the existing conventional options for recording fluid cycles, which have been mechanical in nature (such as U.S. Pat. No. 5,400,650 QED cycle counter used in the landfill gas industry). The conventional devices (and in particular, the apparatus described in U.S. Pat. No. 5,400,650) limit the recording of fluid cycles to mechanical sensed and recorded readings of the fluid cycles with all associated problems. In contrast, the electronic fluid transmission cycle counter and wireless interface of the present disclosure is electronic (via electronic sensor) and employs a wireless interface for data viewing. The use of a wireless interface and electronic sensor to record the fluid cycles broadens the spectrum of potential uses for recording various fluid cycles while limiting the flaws that are associated with the conventional mechanical counters.

Furthermore, even in the best of conditions, the process of taking the recorded readings from the existing mechanical counters is laborious and time consuming because a technician must be physically present at the location of the counter. When there are many mechanical counters to get the recorded readings for, the technician would need to go to each counter and manually record the readings. In addition to being unnecessarily laborious and time consuming, the conventional process for obtaining the readings of the mechanical counters is also prone to human errors, such as writing down the wrong value or reading the wrong value from the counter as a consequence of the counter display being dirty from a corrosive environment or other natural elements.

Adding to these problems, the current mechanical counters are outdated. For example, the landfill gas industry uses wireless interface devices to record the types and flow rates of gases and various other items, but they do not have a wireless interface device to record the cycles of fluid being transmitted through the pneumatic pumps in the field. The electronic fluid transmission cycle counter and wireless interface of the present disclosure uses an electronic sensor along with the wireless interface (and RF communication) to count the fluid transmission cycles and provide the cycle count data, which eliminates the mechanical aspects of the conventional counters the landfill gas industry uses.

By way of example, FIG. 1 conceptually illustrates a block diagram of an electronic fluid transmission cycle counter and wireless interface. The electronic fluid transmission cycle counter and wireless interface shown in this figure includes several functional components. Specifically, the electronic fluid transmission cycle counter and wireless interface includes a fluid transmission cycle counter 1, a magnetic flux source 7, a data collection device 8, and a collection device antenna 9. The fluid transmission cycle counter 1 is a device with an electronic sensor for counting of fluid transmission cycles with a wireless interface and includes a micro-controller 2, a wireless transceiver 3, a device antenna 4, a magnetic flux sensor 5, and diagnostic ports 6. This list of constituent functional components demonstrates an example of a minimal hardware configuration for the electronic fluid transmission cycle counter and wireless interface. As this list of constituent functional components is intended to be exemplary, persons of ordinary skill in the relevant art would appreciate that other components can be added to this list and that this list of components is not intended to limit the electronic fluid transmission cycle counter and wireless interface to just these components. Thus, persons having ordinary skill in the art relevant to the present disclosure may understand there to be equivalent components that may be substituted within the present disclosure without changing the essential function or operation of the electronic fluid transmission cycle counter and wireless interface.

In some embodiments, the micro-controller 2 monitors the state of the magnetic flux sensor 5 and, when a cycle is detected at the magnetic flux source 7, logs an additional cycle count. The micro-controller 2 may detect a cycle at the magnetic flux source 7 due to a pulse in magnetic flux. An example of a pulse in magnetic flux includes, without limitation, an oscillation of a permanent magnet in or in response to the fluid flow. When a technician wishes to read the current data (cycle count data), the data collection device 8 is used to wirelessly communicate to the fluid transmission cycle counter 1 via Radio Frequency (RF) link between the device antenna 4 and the collection device antenna 9. The fluid transmission cycle counter 1 accomplishes this via communication between the micro-controller 2 and the wireless transceiver 3.

In some embodiments, conditional algorithms exist in firmware of the micro-controller 2 for managing power consumption by the fluid transmission cycle counter 1, communication interfaces, and signal conditioning.

Figure 2:
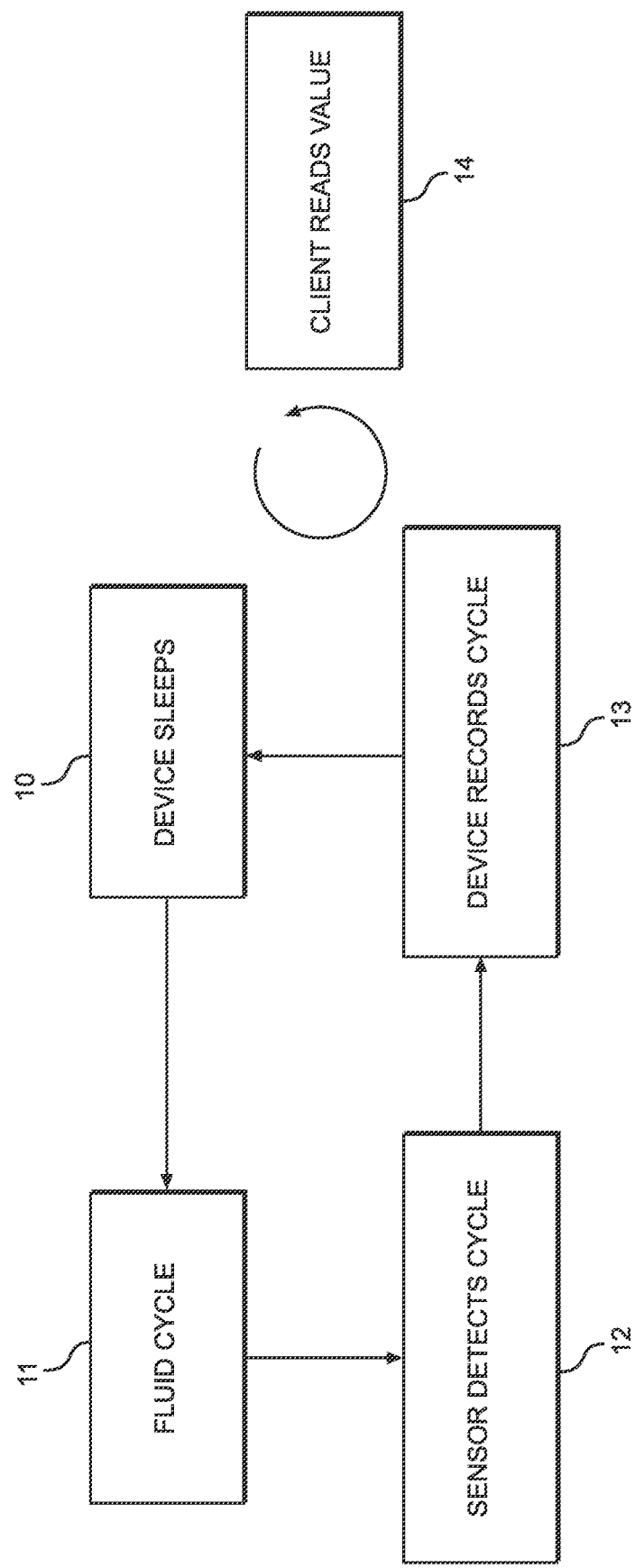
FIG. 2 conceptually illustrates operation of the electronic fluid transmission cycle counter and wireless interface in some embodiments.

The electronic fluid transmission cycle counter and wireless interface of the present disclosure generally works by counting cycles and making the data for the counted cycles available wirelessly to another device. By way of example, FIG. 2 conceptually illustrates operation of the electronic fluid transmission cycle counter and wireless interface. As shown in this figure, during operation the electronic fluid transmission cycle counter device sleeps 10 while a fluid transmission cycle 11 occurs. The fluid transmission cycle 11 is detected 12 by the magnetic flux sensor 5. In response to the sensor detecting the cycle 12, the electronic fluid transmission cycle counter device records the cycle 13. The operation continues with the device sleeping 11, fluid cycle 11 occurring, sensor detecting the cycle 12, and the device recording the cycle 13 until it is stopped. A client device reads the count value 14 whenever a technician wishes.

To make the electronic fluid transmission cycle counter and wireless interface of the present disclosure, the device is manufactured with a printed circuit board (PCB) and commercial ("off the shelf") electronic components. Assembly involves soldering the components to the PCB. In the exemplary implementation of the electronic fluid transmission cycle counter and wireless interface, there is an accompanying mechanical housing which can be machined, cast, or molded. The electronic fluid transmission cycle counter and wireless interface is optionally encased in a hermetic seal appropriate for the environment in which it will be operating. Once the housing is constructed, the electronic fluid transmission cycle counter and wireless interface is inserted into the housing.

In some embodiments, the electronic fluid transmission cycle counter and wireless interface has a minimal hardware configuration of components that ensures functional operation. In some embodiments, the minimal hardware configuration includes the micro-controller 2, the magnetic flux sensor 5, the magnetic flux source 7, the wireless transceiver 3, and the device antenna 4. Diagnostic ports 6 add additional functionality and value to the electronic fluid transmission cycle counter and wireless interface. A housing (not described) aligns the electronic fluid transmission cycle counter and wireless interface in a way that facilitates optimal magnetic flux sensing, while also protecting the device, thereby ensuring that the electronic fluid transmission cycle counter and wireless interface operates optimally in a wider range of conditions.

In some embodiments, the wireless transceiver 3 can be changed to allow the electronic fluid transmission cycle counter 1 to communicate over a longer range and distance. Another component that is capable of change is the magnetic flux sensor 5, which can be replaced with another sensor type capable of detecting a cycle, such as (but not limited to) a pressure sensor, an optical sensor, a capacitive sensor, etc.

To use the electronic fluid transmission cycle counter and wireless interface of the present disclosure, the electronic fluid transmission cycle counter and wireless interface is installed in a pathway of the fluid being cycled. After installing the electronic fluid transmission cycle counter and wireless interface in the pathway, an electronic device is then connected to the electronic sensor, via wireless interface, to record the fluid transmission cycles.

Additionally, the electronic fluid transmission cycle counter and wireless interface of the present disclosure can be adapted for use in any industry that currently records, monitors, or counts fluid cycles mechanically. Exemplary industries include, without limitation, landfill gas, oil, gas, and dairy industries.

The above-described embodiments of the invention are presented for purposes of illustration and not of limitation. While these embodiments of the invention have been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. An electronic fluid transmission cycle counter and wireless interface comprising:
   a magnetic flux source associated with fluid flow in a fluid transmission cycle;
   a mobile electronic data collection device with a data collection device antenna, wherein the mobile electronic data collection device wirelessly receives fluid cycle data captured in connection with the fluid flow of the fluid transmission cycle and records the fluid cycle data in a persistent data storage of the mobile electronic data collection device, wherein the mobile electronic data collection device comprises a screen that is configured to display the fluid cycle data for viewing and analysis by a technician operating the electronic data collection device;
   a fluid transmission cycle counter that is installed in a pathway of a fluid being cycled, said fluid transmission cycle counter comprising a magnetic flux sensor that detects a pulse in magnetic flux at the magnetic flux source associated with fluid flow in the fluid transmission cycle, a micro-controller that monitors the magnetic flux sensor and logs fluid cycle data of the fluid transmission cycle for the detected pulse in magnetic flux, a wireless transceiver and transceiver device antenna which transmit the logged fluid cycle data to the external electronic data collection device, and at least one diagnostic port, wherein the micro-controller includes firmware comprising conditional algorithms for managing power consumption by the fluid transmission cycle counter; and
   a mechanical housing that encapsulates the fluid transmission cycle counter and aligns the fluid transmission cycle counter to optimally detect pulses of magnetic flux.

2. The electronic fluid transmission cycle counter and wireless interface of claim 1, wherein a pulse in magnetic flux comprises an oscillation of a permanent magnet in response to the fluid flow.

3. The electronic fluid transmission cycle counter and wireless interface of claim 1, wherein the diagnostic port enables a wired data connection to a diagnostic device to evaluate an operational status of the fluid transmission cycle counter.

4. The electronic fluid transmission cycle counter and wireless interface of claim 1 further comprising a pressure sensor that is capable of detecting a fluid pressure cycle.

5. The electronic fluid transmission cycle counter and wireless interface of claim 1 further comprising an optical sensor that is capable of visibly detecting a fluid cycle.

6. The electronic fluid transmission cycle counter and wireless interface of claim 1 further comprising a capacitive sensor that is capable of detecting a conductive cycle.

7. The electronic fluid transmission cycle counter and wireless interface of claim 1, wherein the magnetic flux sensor detects repeated pulses in magnetic flux in connection with repeated fluid transmission cycles over the fluid cycling pathway.

8. The electronic fluid transmission cycle counter and wireless interface of claim 7, wherein the micro-controller logs repeated fluid transmission cycles as a continuous count of cycles for each additional detected pulse in magnetic flux, wherein the transceiver device antenna wirelessly transmits the fluid cycle data logged by the micro-controller in connection with each fluid transmission cycle to the data collection device antenna for external recording by the electronic data collection device.

9. The electronic fluid transmission cycle counter and wireless interface of claim 1, wherein the transceiver device antenna supports a radio frequency (RF) link to the data collection device antenna of the external electronic data collection device.

10. The electronic fluid transmission cycle counter and wireless interface of claim 9, wherein the RF link allows wireless transmission of the logged fluid cycle data to the external electronic data collection device for a technician to view on a display screen of the external electronic data collection device without being physically present at a location of the electronic fluid transmission cycle counter and wireless interface.

11. The electronic fluid transmission cycle counter and wireless interface of claim 1, wherein the fluid comprises a corrosive gas that flows through a fluid line in a landfill gas site.

12. The electronic fluid transmission cycle counter and wireless interface of claim 11, wherein the mechanical housing comprises a hermetic seal that encapsulates the fluid transmission cycle counter in a manner prevents the corrosive gas from corroding the fluid transmission cycle counter.

13. The electronic fluid transmission cycle counter and wireless interface of claim 11, wherein the technician operates the mobile electronic data collection device at a distant location away from the landfill gas site, wherein the fluid transmission cycle counter is installed at the fluid line in the landfill gas site and transmits the fluid cycle data to the mobile electronic data collection device at the distant location away from the landfill gas site.

* * * * *